United States Patent
Short et al.

(10) Patent No.: US 7,492,293 B2
(45) Date of Patent: Feb. 17, 2009

(54) VARIABLE RATE ANALOG-TO-DIGITAL CONVERTER

(75) Inventors: Robert Townsend Short, Vista, CA (US); Ghobad Heidari-Bateni, San Diego, CA (US); Layne Lisenbee, San Diego, CA (US)

(73) Assignee: Olympus Communication Technology of America, Inc., San Diego, CA (US)

( * ) Notice: Subject to any disclaimer, the term of this patent is extended or adjusted under 35 U.S.C. 154(b) by 0 days.

(21) Appl. No.: 11/692,767

(22) Filed: Mar. 28, 2007

(65) Prior Publication Data

US 2008/0238717 A1    Oct. 2, 2008

(51) Int. Cl.
*H03M 1/00*    (2006.01)
(52) U.S. Cl. ......................................... 341/123; 314/61
(58) Field of Classification Search ................... 341/123, 341/118, 61; 702/107
See application file for complete search history.

(56) References Cited

U.S. PATENT DOCUMENTS

| | | | | |
|---|---|---|---|---|
| 5,619,202 A | * | 4/1997 | Wilson et al. | 341/143 |
| 5,872,540 A | * | 2/1999 | Casabona et al. | 342/362 |
| 6,005,506 A | * | 12/1999 | Bazarjani et al. | 341/143 |
| 6,347,288 B1 | * | 2/2002 | Trammell et al. | 702/107 |
| 6,392,584 B1 | * | 5/2002 | Eklund | 341/183 |
| 6,507,799 B2 | | 1/2003 | Steffen | |
| 2005/0123036 A1 | | 6/2005 | Rahman et al. | |
| 2006/0218410 A1 | * | 9/2006 | Robert et al. | 713/189 |

\* cited by examiner

*Primary Examiner*—Jean B Jeanglaude
(74) *Attorney, Agent, or Firm*—Sheppard Mullin Richter & Hampton LLP

(57) ABSTRACT

An analog-to-digital converter can use a variable sampling rate. By using a variable sampling rate analog-to-digital converter and an anti-aliasing filter lower sampling rates, and accordingly, generally lower power consumption may be achieved. For example, a lower sampling rate can be used when it is determined that no undesirable signals are present and a higher sampling period can be used when an undesirable signal is present. Determining the presence of an undesired signal can be based on signal-to-noise ratio, over-sampling, bit error rate, using a detector, etc. An undesirable signal can be any signal that is close in frequency to a signal of interest or a signal farther away in frequency that has a relatively high amplitude. Sampling rate can be varied in a binary fashion, stepwise, continuously, etc.

31 Claims, 3 Drawing Sheets

VARIABLE RATE ANALOG-TO-DIGITAL CONVERTER

TECHNICAL FIELD

The present invention relates generally to wireless communication, and more particularly, some embodiments relate to analog-to-digital converters.

DESCRIPTION OF THE RELATED ART

For many electronic devices power consumption and battery life might be important design considerations. This might be especially true for ultra-wideband wireless devices because these devices might consume a great deal of battery power when processing these ultra-wideband signals. Many of these wireless devices might include analog-to-digital converters ("ADC").

An ADC is an electronic circuit that converts continuous (analog) signals to discrete digital numbered representations of the original analog signal. To convert the continuous analog signal into a series of digital values, the analog signal is periodically sampled. The amplitude of a signal at the sample time might then be converted to a digital value. The rate at which the analog signal is sampled is called the "sampling rate" or "sampling frequency" of the ADC.

ADCs can, in many cases, consume a significant portion of the power used by an electronic device. Accordingly, lowering the power consumed by an ADC can, in many cases, have a significant impact on the overall power used by the wireless device. One of the factors that might affect the power consumed by an ADC is the sampling rate of the ADC.

As discussed, the sampling rate is the number of times that an electromagnetic signal on an input to the ADC is measured (i.e., sampled) in a given unit of time. Generally, a lower sampling rate might decrease the power consumed by the ADC. If the sampling rate is simply lowered to decrease power consumption, however, the electronic device that contains the ADC might not operate properly because the ADC might not function as required. For example, an ADC should typically sample at a sampling rate that is at least two times the bandwidth of any signal that needs to be converted to digital form for further processing in the electronic device. Accordingly, if a signal of interest includes frequency content that begins at or near 0 Hz and includes frequency content through 20 kHz, then the ADC should sample at a frequency of at least 40 kHz so that all of the frequency content of the signal of interest is converted to digital form.

The sampling rate of an ADC, accordingly, might be limited by the characteristics of a signal that is being converted from analog to digital. The sampling rate of the ADC is, however, also limited by other factors. One such factor might be the nature of the circuitry in the processing chain prior to the ADC. For example, an anti-aliasing filter might be used. This filter can limit the ADC sampling rate because it might limit the highest frequency input into the ADC. Generally, the ADC sampling rate will not need to be much greater than two times the highest frequency input the ADC. Additionally, some ADC systems might use an analog filter with a sharp cut-off, while other ADC systems might use a filter that is not as sharp in conjunction with, for example, over-sampling. Over-sampling can, for example, be used to compensate for an anti-aliasing filter that is not as sharp. Accordingly, these design selections can influence the ADC sampling rate.

As discussed, the analog input to an ADC will generally have an anti-aliasing filter. The purpose of this filter is to eliminate, or at least reduce undesired signals that might otherwise be input into the ADC and converted into unwanted digital signals. For example, again assume that the signal of interest includes frequency content from 0 to 20 kHz. Further assume that the ADC samples at 40 kHz. Other (unwanted) signals might also exist on the analog input to the ADC. Assume that these unwanted signals have frequency components that run from 30-40 kHz. If these unwanted signals are allowed to be input into the ADC, the ADC will convert them into unwanted digital signals. Because these unwanted signals are outside the useful 20 kHz bandwidth of the ADC, at its current sample rate they will create an unwanted alias signal that will be impossible to differentiate from lower frequency signals that are within the ADC's useful bandwidth. For example, a 20 kHz signal cannot be differentiated from a 40 kHz signal when sampled at 40 kHz. Using the example of a 40 kHz ADC sampling rate, signals that lie outside the useful bandwidth of 20 kHz are said to alias into the frequency band of the desired. Aliased signals might appear to subsequent digital processing algorithms as noise in the same band as the signal of interest.

The unwanted signals might be dealt with in a few different ways. As discussed, one system might use an anti-aliasing filter with a sharp cut-off at or just above 20 kHz. This anti-aliasing filter is coupled to the analog input of the ADC. The unwanted signal from 30-40 kHz will then be filtered out, and the ADC analog input will only convert the desired signal that runs from 0 to 20 kHz (not considering any noise or low power residual undesired signals). Returning to the 20 kHz and 40 kHz example, while a 20 kHz signal cannot be differentiated from a 40 kHz when an ADC sampling at 20 kHz is used, the device does not have to differentiate the 20 KHz signal from the 40 kHz signal because the 40 kHz signal is filtered out.

Analog filters with sharp cut-offs can, however, be expensive in terms of component costs, power used by these components, board space on a printed circuit board, die space on an integrated circuit, design time, etc. Accordingly, another way to deal with these unwanted signals is to over-sample. By over-sampling the unwanted signals might be differentiated from the signals of interest. For example, if the ADC in a system samples at 80 kHz the signals of interest from 0 to 20 kHz and the unwanted signals from 30 kHz to 40 kHz will not be aliased and might then be processed digitally. For example, the unwanted signals might be digitally filtered. This might, however, use up a great deal of energy because, as discussed above, one of the factors that might impact the power consumed by an ADC is the sampling rate of the ADC. Additionally, recall that a higher sampling rate generally leads to greater power consumption by the ADC. This increased power consumption might be a significant drawback, especially in battery-powered devices.

Another attempt to solve this problem is to use an anti-aliasing filter in conjunction with over-sampling. Depending on the exact implementation, this solution might, to varying degrees, have these same problems. For example, if a less expensive anti-aliasing filter is used, it might not be sharp enough to filter out the undesired signals and greater over-sampling might be required. If a sharper anti-aliasing filter is used, a lower amount of over-sampling might be required, but the filter will generally be more expensive in terms of components, board space, power consumption, design time, etc.

BRIEF SUMMARY OF EMBODIMENTS OF THE INVENTION

According to various embodiments of the invention, a variable rate ADC might be used in conjunction with a filter, such as an anti-aliasing filter, to allow the use of lower sampling rates, and accordingly, generally lower power consumption. In one embodiment, a variable rate ADC might be used in conjunction with an anti-aliasing filter to allow the use of lower sampling rates, and accordingly, generally lower power consumption. These lower sampling rates can be used when no undesired signals are present in a frequency range of interest. In one embodiment a variable rate ADC might be implemented to enable utilization of a less complex anti-aliasing filter than might otherwise be required. For example, in one embodiment a simple RC low pass filter might be used. In another embodiment a more complicated filter topology might be used. The filter design topology selected might depend on the specific requirements of the given system.

In one embodiment an electronic device comprising an analog-to-digital converter might be configured to have an adjustable sampling rate that might be controlled by a controller. The controller might be, for example, a processor, microprocessor, microcontroller, digital logic, etc. The digital logic can include, but is not limited to, discrete logic or programmable logic, such as PLDs, FPGAs, CPLDs, or ASICs, etc. Further, the controller might be implemented using some combination of these. The controller might be coupled to the analog-to-digital converter and configured to control the adjustable sampling rate of the analog-to-digital converter. For example, the controller might determine that no undesired signals are present in a frequency range of interest and set the sampling rate based on the absence of undesired signals in the frequency range of interest.

In another embodiment the electrical device might further comprise an analog anti-aliasing filter coupled to an analog input to the analog-to-digital converter. In various examples the analog anti-aliasing filter might comprise a passive filter such as an RC low pass filter. In other examples the analog anti-aliasing filter might comprise more complicated filter topologies, such as an active filter.

In some embodiments the electrical device might further comprise a digital filter coupled to a digital output of the analog-to-digital converter and configured to digitally filter the output of the analog-to-digital filter. This digital output can, in many cases, include multiple bits.

The controller might be further configured to determine that an undesired signal is present in a frequency range of interest. Accordingly, the controller might set the sampling rate based on the presence of the undesired signal in the frequency range of interest. For example, the sampling rate might be set to over-sample the analog input of the analog-to-digital converter such that the undesired signal might be filtered digitally.

In another embodiment the controller might be configured to measure a signal quality metric, such as signal-to-noise ratio, bit error rate, etc. If a portion of the noise is due to aliased undesired signal components, the controller might increase the sampling rate to improve the quality metric.

In another embodiment the frequency range of interest for undesired signals might be limited by an analog anti-aliasing filter on an input to the analog-to-digital converter. For example, if all signals above a certain frequency are filtered out before they are input into an input on the analog-to-digital converter, then it would be unnecessary to look for any undesired signals above this frequency because they are already filtered out. Further, it might not be necessary to over-sample at a sample rate that is more than about two times the cut-off frequency of the analog anti-aliasing filter because the anti-aliasing filter might filter out any undesired signals above the cut-off frequency. Any undesired signals below the cut-off frequency of the analog anti-aliasing filter might still need to be converted to digital form and digitally filtered if, for example, it is determined that these signals are present.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the following figures. The drawings are provided for purposes of illustration only and merely depict typical or example embodiments of the invention. These drawings are provided to facilitate the reader's understanding of the invention and shall not be considered limiting of the breadth, scope, or applicability of the invention. It should be noted that for clarity and ease of illustration these drawings are not necessarily made to scale.

Figure 1:
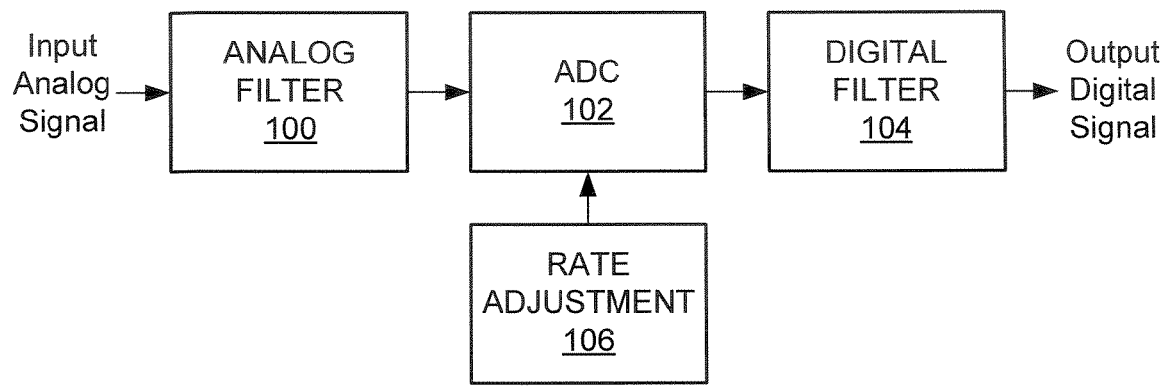
FIG. 1 is a block diagram illustrating an example analog-to-digital conversion system that might be used to implement variable rate ADC in accordance with one embodiment of the invention.

The figures are not intended to be exhaustive or to limit the invention to the precise form disclosed. It should be understood that the invention might be practiced with modification and alteration, and that the invention is limited only by the claims and the equivalents thereof.

DETAILED DESCRIPTION OF THE EMBODIMENTS OF THE INVENTION

The present invention is directed toward systems and methods for implementing variable rate analog-to-digital conversion, or ADC. In various embodiments, variable rate ADC might be implemented to use sampling rates, where possible, that are lower than the sampling rate that might otherwise be used for a conventional fixed-rate ADC. For example, because sampling rates for a conventional ADC are selected based on worst-case requirements, such sampling rates are typically higher than otherwise required for non-worst-case operation. As such, implementing a variable rate ADC might be done to allow sampling rates to be adjusted to a higher sampling rate to address worst-case (or nearly worst-case) operational modes and to be adjusted to a lower sampling rate when the higher sampling rates are not needed.

Before describing the invention in detail, it is useful to describe an example environment in which the invention might be implemented. One such example is a wireless mobile device. The example wireless mobile device might be a battery powered communication device, such as a mobile telephone handset, PDA, or any other device that might use an analog-to-digital converter ("ADC"). Because the device might be battery powered, power consumption might be an important design consideration. Further, because in many cases an ADC might use a large amount of electrical power, it might be important to implement systems and methods that might decrease the power consumption of the ADC.

It will be understood by a person of ordinary skill in the art that this is only one example environment in which the systems and methods described herein might be implemented. Other types of devices might also benefit from these systems and methods. In fact, almost any ADC implementation might include these systems and methods. For example, an electronic device that is not portable or battery powered might still implement some or all of the systems and methods described herein, for example, to lower power consumption. This might be especially important in systems that include a large number of ADCs, even if those systems are not battery powered. As long as a device includes one or more ADCs it might be implemented using the systems and methods described herein.

From time-to-time, the present invention is described herein in terms of these example environments. Description, in terms of this environment, is provided to allow the various features and embodiments of the invention to be portrayed in the context of an exemplary application. After reading this description, it will become apparent to one of ordinary skill in the art how the invention can be implemented in different and alternative environments.

FIG. 1 is a block diagram illustrating an example of a variable rate analog-to-digital conversion system in accordance with one embodiment of the invention. The example ADC system illustrated in FIG. 1 includes a filter 100, and ADC 102, a rate adjustment module 106 and a digital filter 104. Filter 100, might be implemented as, for example, an analog filter 100 for anti-alias filtering. In one embodiment, to avoid aliasing, the input to an ADC 102 might be low-pass filtered. This low pass filtering might remove, for example, frequencies above half the sampling rate.

Recall that to convert an analog signal to digital it is typically sampled at a rate that is at least two times the bandwidth. Accordingly, any signals of frequencies below half the sampling rate can be digitally filtered. It might, therefore, be advantageous to use an analog filter 100 with a cut-off frequency that is half the sampling rate.

While several examples are discussed herein with respect to low pass filters, a person of ordinary skill in the art will understand that other types of filters 100 might also be used. For example, although aliasing is unwanted in many systems, it might, in some cases, be used to provide simultaneous down-mixing of a band-limited high frequency signal. Accordingly, in some embodiments analog filter 100 might be a band pass filter that might be used to limit the bandwidth of a high frequency signal.

ADC 102 accepts the analog input signal from the filter 100, samples it, and outputs a digital data stream that is a digital representation of the analog input signal. The sampling rate of an ADC 102 should preferably be at least twice the bandwidth of the signal of interest. ADC 102 might be any of the various ADC designs, for example, a direct conversion ADC or flash ADC, a successive-approximation ADC, a delta-encoded ADC, a ramp-compare ADC (also called integrating, dual-slope or multi-slope ADC), a pipeline ADC (also called subranging quantizer), a Sigma-Delta ADC (also known as a Delta-Sigma ADC), or any other type of ADC, as long as the sampling rate of the ADC 102 is adjustable.

The digital output of the ADC 102 might be further processed digitally. For example, a digital output of the ADC 102 might be digitally filtered using digital filter 104. In this way any unwanted signals within the correct bandwidth (e.g., one-half the sample rate) might be filtered out. Assuming a sample rate of 40 kHz, the correct range of frequencies can be, for example, 0 kHz to 20 kHz, 2 kHz to 22 kHz, 20 kHz to 40 kHz, etc., as long as the bandwidth is 20 kHz. This filtering can be completed so that, for example, these unwanted signals do not interfere with other circuitry that might be coupled to the ADC 102 through the digital filter 104.

The ADC 102 might be coupled to a rate adjustment device 106. The rate adjustment device 106 might be, for example, a controller. The controller can comprise hardware, software, or both. For example, the controller can comprise a processor, microprocessor, or microcontroller. The controller can also include software running on the processor, microprocessor, or microcontroller. In one embodiment the controller can comprise digital logic. The digital logic can be discrete logic, programmable logic, such as PLDs, FPGAs, CPLDs, or ASICs, etc. In another embodiment the digital logic, for example an FPGA, might be configured to implement a processor. This processor might execute software. The controller can also be some combination of these.

The designer of a particular embodiment is typically faced with many design trade-offs, including component costs, power used by those components, board space on a printed circuit board, die space on an integrated circuit, design time, etc., as discussed above. The systems and methods described herein might be implemented to allow the designer more flexibility in deciding among these different trade-offs. For example, in one embodiment, perhaps it is known for a given application that unwanted signals are rare or intermittent, or that any unwanted signals are at a much higher frequency than the signal of interest. In such cases, a designer might decide to use a simple RC circuit as an anti-aliasing filter. In this embodiment most of the time the ADC might be sampled at a low sample rate even though it has a simple RC anti-aliasing filter. This is because most of the time there will either be no unwanted signal that needs to be filtered out, or the signal will be at a frequency that is far enough away (in frequency) from the frequency of interest that an RC filter might filter out the unwanted signal. In this embodiment, whenever an undesired signal that is close in frequency to the signal of interest is encountered, the device might be configured to detect this condition and increase the sampling rate to over-sample and digitally filter the undesired signal out. This might cause increased power consumption while over-sampling. However, under the original assumptions for this embodiment, the average power consumption of the circuit might be smaller than a system that over-samples continuously, potentially reducing power consumption.

In another embodiment, a more complicated anti-aliasing filter might be used in conjunction with a variable rate ADC. For example, assume in this embodiment that a large number of unwanted signals are present. In this embodiment, the designer might decide to use a more complicated anti-aliasing filter in an attempt to eliminate or at least decrease the amplitude of many of these unwanted signals. Any unwanted signals that are not adequately filtered out might be further filtered digitally by over-sampling the signal and then digitally processing the resulting digital data stream to remove the unwanted components. At certain times it still might be possible to decrease or eliminate the over-sampling based on the absence of certain unwanted signals at certain frequencies. Accordingly, power consumption might still be lessened from time to time using the systems and methods described herein. The designer might determine, for any of the various embodiments, an acceptable trade-off between power consumption, cost, etc. Based on this acceptable trade-off, the selection of the analog filter 100, the use of over-sampling, etc. can be made.

The over-sampling frequency might be selected based on the cut-off frequency of the analog filter 100. For example, in one embodiment, if the cut-off frequency of the filter 100 is $f_1$ then the sampling rate for the ADC 102 might be $2*f_1$, in this way the system should be able to digitally filter any signals up to and including signals with a maximum frequency of $f_1$. This might be adequate, in some embodiments, because signals with frequency content above $f_1$ might be filtered out by analog filter 100. In another embodiment, the over-sampling might be greater than $2*f_1$, this might be useful, for example, in systems that use an analog filter 100 that does not have a sharp cut-off because an analog filter 100 that does not have a sharp cut-off might not fully filter signals near, but slightly greater than $f_1$. (Note that signals near $f_1$ that are slightly less than $f_1$ might be detected by over-sampling in both embodiments.) Many different combinations of cut-off frequency and over-sampling frequency are possible, as will be understood by a person of ordinary skill in the art.

Figure 2:
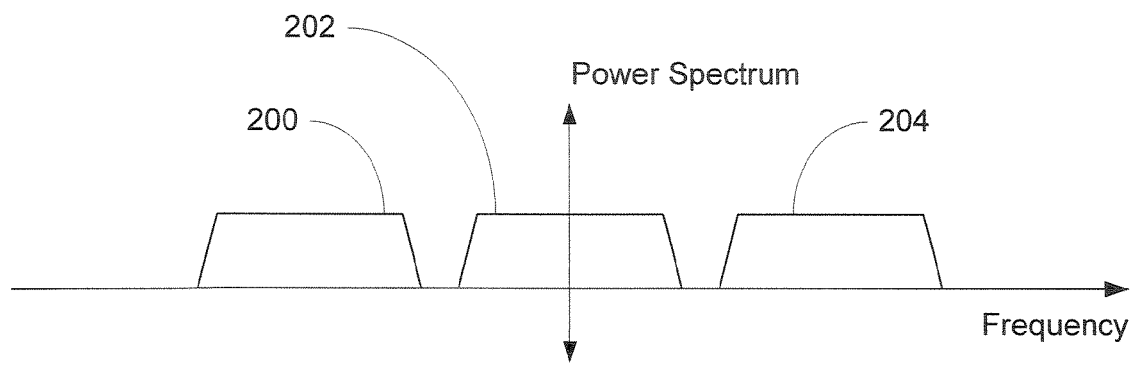
FIG. 2 is a diagram illustrating a spectral representation of input analog signals.

FIG. 2 is a diagram illustrating a spectral representation of input analog signals. Consider an example where a signal of interest 202 might be centered on 0 Hz, while undesired signals 200 and 204 are illustrated at higher frequencies. Note that the diagram illustrates both positive and negative frequency representations of the signals 200, 202, and 204. (Signal 200 is actually the negative frequency representation of signal 204.)

Depending on the frequency and the amplitude of the undesired signals 200 and 204, the power requirements for the system, the budget for the system, the size of the system, the availability of battery power, etc., different implementations of the systems and methods described herein might be used. For example, if the undesired signals 200 and 204 are located near the frequency of the signal of interest 202, it might be necessary to use a more complicated anti-aliasing filter, possibly, in conjunction with over-sampling. These components might be used, for example, when the undesired signals 200 and 204 are present.

In one embodiment, the invention might be configured to detect the presence and magnitude of undesired signals 200, 204. When the undesired signals 200 and 204 are not present, the system might be configured to discontinue or reduce the level of over-sampling. In this way power consumption can, in some embodiments, be decreased. In addition to detecting the presence or absence of undesired signals 200, 204, the invention might be implemented to detect the level of the undesired signals 200, 204, their frequencies or other characteristics, and adjust the sampling rate accordingly.

If the undesired signals 200 and 204 only include frequency components that are far from the signal of interest 202, a simple RC filter might be selected, for example. This is not intended to imply that a simple RC filter might not be used when the undesired signals 200 and 204 include frequency components close to the signal of interest 202. The filter can be selected in conjunction with the other methods that are used to filter any remaining undesired signals 200 and 204 after theses signals are analog filtered. The other methods can include, for example, over-sampling.

In another embodiment, the invention might be configured to determine the frequency of the undesired signals 200, 204. This might be beneficial, for example, in an operating environment where the frequency of undesired signals varies. Thus, the invention can be configured to sense the presence of interfering signals and adjust the sampling rate accordingly.

While several examples are discussed that include a signal of interest centered at 0 Hz, a person of ordinary skill in the art will understand that the systems and methods described herein might be used in conjunction with many other frequency ranges for almost any signal of interest 202 and almost any undesired signal 200 and 204. Further, some embodiments might include multiple frequency ranges of signals of interest 202, multiple frequency ranges for undesired signals 200 and 204, or both.

In one embodiment an analog filter might reduce the amount of power in an undesired signals so that an ADC might sample at a rate of approximately $2*f_{h1}$ where $f_{h1}$ is the highest frequency component of the signal of interest 202, and the resulting amount of power in the undesired signal might be negligible. In practice, however, building an analog filter to reduce sufficiently the power of the undesired signal to avoid aliasing at a sample rate of $f_{h1}$ might, in some cases, be impractical. Accordingly, in some cases, a more practical filter can be used in conjunction with over-sampling when necessary while decreasing the sampling rate when possible to take advantage of possible energy savings.

Figure 3:
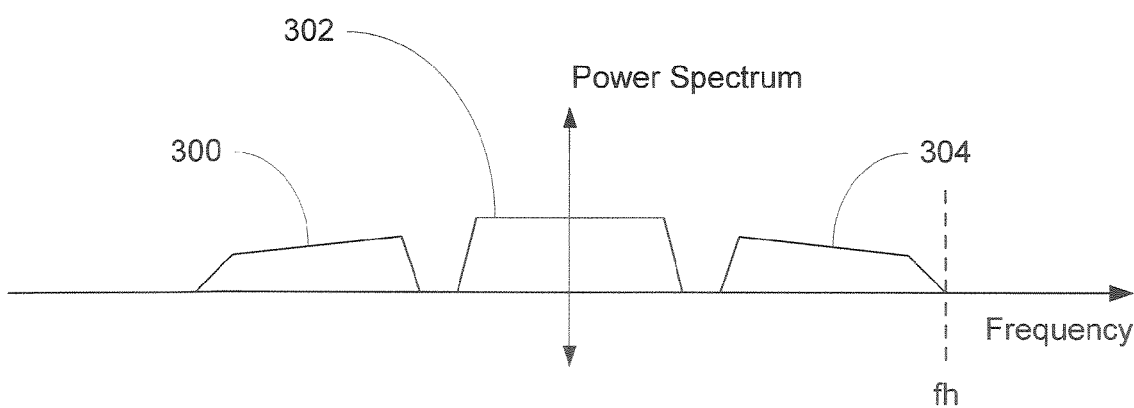
FIG. 3 is a diagram illustrating a spectral representation of the input analog signals of FIG. 2 after analog filtering.

FIG. 3 is a diagram illustrating a spectral representation of the input analog signals of FIG. 2 after analog filtering. In one embodiment, a sampling rate of $f_h$ might be used, where $f_h$ might be, for example, the highest frequency including any residual undesired signal. Ideally, after filtering, the signal of interest 302 will be the same as the signal of interest 202 of FIG. 2 while the undesired signals 200 and 204 of FIG. 2 will be completely filtered out. FIG. 3, however, illustrates a more practical case. Real filter responses do not meet the ideal response of some analytical model filters. Additionally, it might be expensive to design filters that approximate the ideal response of a model filter. For example, some filters can be expensive in terms of component costs, power used by those components, board space on a printed circuit board, die space on an integrated circuit, design time, etc. Accordingly, FIG. 3 illustrates one example of a spectral representation of the input analog signals of FIG. 2 after analog filtering.

As illustrated in FIG. 3, the signal of interest 302 is, at least approximately, the same as the signal of interest 202 of FIG. 2. How close signals 202 and 302 need to match might vary greatly from implementation to implementation. Undesired signals 300 and 304 have been filtered and are lower in amplitude than the corresponding undesired signals 200 and 204. Exactly how much filtering is needed might vary greatly from implementation to implementation. For example, some embodiments might rely more on over-sampling, while other embodiments rely more on the fact that unwanted signals are usually not present. Some embodiments might rely on sharp analog filtering, while other embodiments might rely less on analog filtering. A combination of these might also be implemented, for example, some over-sampling with an analog filter that would not need to be quite as sharp as one used in the absence of the over-sampling. Generally, regardless of how often unwanted signals are present or not present, the systems and methods described herein might be implemented as part of an electronic device that includes one or more ADCs.

Figure 4:
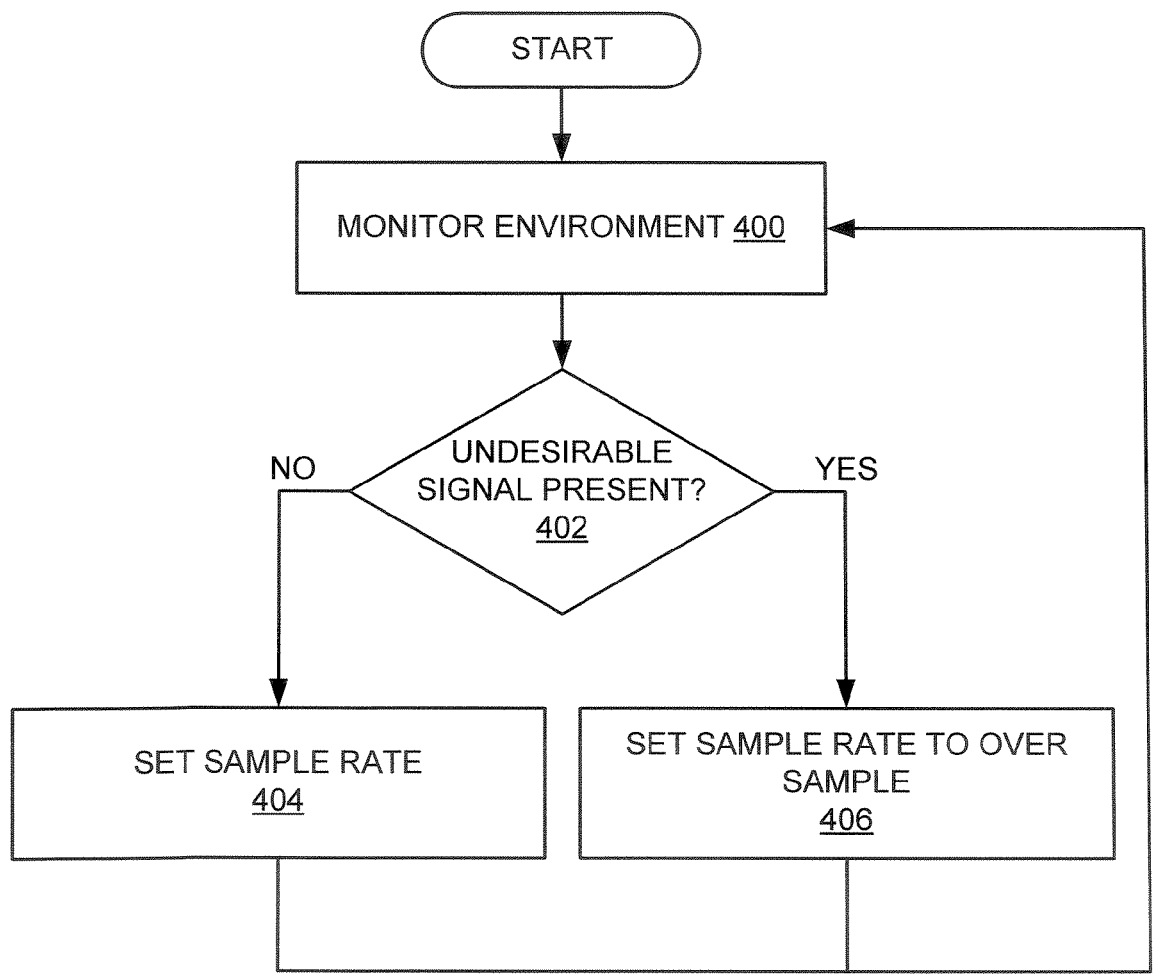
FIG. 4 is a flowchart illustrating one example method of setting a sampling rate in accordance with one embodiment of the invention.

FIG. 4 is a flowchart illustrating one example method of adjusting the sampling rate in accordance with one embodiment of the invention. In step 400, an RF environment can be monitored. The presence or lack of an undesired signal is determined in step 402. This determination might be made in a variety of ways. For example, ADC 102 might over-sample for a short period of time to determine what signals are present. In another embodiment the signal-to-noise ratio ("SNR") can be used. In yet another embodiment, an RF detector configured to detect RF signals in a frequency range of interest can be used.

In step 404, if an undesirable signal is not present, a sample rate is set. This sample rate might be two times the highest frequency of interest, or perhaps greater. This can vary from implementation to implementation. Generally, the sample rate will not be lower than two times the highest frequency of interest, but it might be. For example, with a band limited signal, that does not begin a 0 Hz, the sample rate might be two times the bandwidth of the signal.

In a step 406, if an undesirable signal is determined to be present, an over-sample rate can be set. This sample rate might be, for example three, four, or five times the highest frequency of interest, or perhaps much greater. The foregoing examples are not meant to imply that an integer multiple must be used. The sample rate might also be based on the bandwidth of a band-limited signal. In one embodiment, the sample rate can be based on the frequency cut-off of an anti-aliasing filter. For example, in step 406, if an undesirable signal is determined to be present, the over-sample rate can be set at two times the frequency cut-off of the anti-aliasing filter, or perhaps higher.

It will be understood by a person of ordinary skill in the art that, while the embodiment illustrated in FIG. 4 includes two possible sample rates, many other sample rates are possible. Sample rates can vary continuously based on, for example, signal quality. Sample rates can also vary stepwise. For example, a low sample rate, a medium sample rate, and a high sample rate, are possible. These rates can be selected based on, for example, the SNR. If the SNR of a signal is good, for example, a low sample rate can be used. Conversely, if the SNR is poor, and the noise is due to aliased signal components then a high sample rate can be used. If the SNR is somewhere in the middle then the medium sample rate can be used. Other metrics besides SNR can also be used, for example, bit error rates, measurement of an undesired signal, etc. Almost any measure of the quality or acceptability of an incoming signal can be used.

It will also be understood by a person of ordinary skill in the art that the presence or absence of an undesirable signal might be relative. For example, a signal might be located within a frequency range of interest but have such a low amplitude that it does not adversely effect the signal of interest. Accordingly, while it might be a signal that is unwanted because performance might improve if the signal was not there, it might not be an undesirable signal. For example, the SNR or the bit error rate might be acceptable. Further, a signal that is of high amplitude might be an undesirable signal even if the signal's frequency is relatively far from the signal of interest. Accordingly, the frequency range of interest might vary with amplitude. Alternatively, a lower amplitude signal that has frequency content that is very close, or perhaps the same as, a signal of interest might be an undesirable signal. For example, because SNR or bit error rate are unacceptable. Additionally, in one embodiment a baseline sample rate can be selected. The sample rate might then be adjusted based on conditions, (e.g., SNR bit error rate, etc.) The baseline might vary from implementation to implementation.

Many different methods can be used to determine the presence or absence of unwanted signals. As with over-sampling to digitally filter unwanted signals, over-sampling to determine what signals are present might use a cut-off frequency based on the analog filter 100. For example, in one embodiment, if the cut-off frequency of the filter 100 is $f_1$ then the sampling rate for the ADC 102 might be $2*f_1$. In this way the system should be able to process a digital representation of all signals up to and including signals with a maximum frequency of $f_1$. This might be adequate, in some embodiments, because signals with frequency content above $f_1$ might be filtered out by analog filter 100. In another embodiment, the over-sampling might be greater than $2*f_1$, this might be useful, for example, in systems that use an analog filter 100 that does not have a sharp cut-off. This is because an analog filter 100 that does not have a sharp cut off might no fully filter signals near, but slightly greater than $f_1$. (Note that signals near $f_1$ that are slightly less than $f_1$ might be detected by over-sampling in both embodiments.) Many different combinations of cut off frequency and over-sampling frequency are possible, as will be understood by a person of ordinary skill in the art.

In another embodiment SNR can be used to predict when an undesired signal might be present. The sampling rate might then be changed, based on a low SNR, because this might indicate that an undesired signal is present. Alternatively, the SNR of the signal of interest can be low because the signal of interest received has a low enough power that aliased out-of-band noise impacts performance. If the total energy observed in the signal using the reduced sampling rate exceeds a threshold, but signal detection has not occurred, then either (a) a low SNR input signal is present, or (b) an undesired signal is present. In either case, the sample rate might be increased to allow detection and classification to proceed. Additionally, the digital filter might also be changed to accommodate changes in sample rate.

In another embodiment a signal detector configured to detect signals in a frequency band of interest might be used to determine if undesired signals are present. If these undesired signals are present, then the systems and methods described herein might be applied to, for example, filter out these signals.

In another embodiment certain frequencies might be digitally filtered without predetermining the presence of any undesired signals. For example, the sampling rate for the ADC 102 might be some integer multiple of a given clock frequency in the system. This might, in some cases, limit the sampling rates that are selectable. Any signals that are converted to digital form can be digitally filtered. Accordingly, any signals up to one-half the minimum sampling frequency set by the clock frequency of the system can be digitally filtered and, because the clock frequency cannot, in this embodiment, be lowered any further, it might not be advantageous to discontinue digital filtering when no undesired signals are present in the frequency range of interest. It might, however, still be advantageous to discontinue digital filtering if the circuitry used in that filtering consumes excessive power, or could be otherwise used for another purpose (e.g., reconfigurable circuitry) or to filter other signals.

In one embodiment, the systems and methods described herein take advantage of the fact that, when no undesired signal is present, an analog filter or over-sampling might not be needed because there is no signal to remove. Accordingly, a less complicated analog filter might be used and the sampling rate might be reduced to, for example, approximately twice the highest frequency in the signal of interest. The sample rate can be increased when necessary to digitally filter signals that are not filtered by analog filter 100. In one embodiment a rate adjustment mechanism that reduces the sample rate of the ADC might be used.

In some cases it might still be important for an analog filter to reduce out-of-band thermal noise. This is because unfiltered thermal noise will alias as well. Other known mechanisms to reduce thermal noise related aliasing might be used in conjunction with the systems and methods described herein.

In one embodiment additional benefits might also be provided. In many cases, for example, the WiMedia UWB system or other frequency-hopping system, the desired signal might occupy one of several bands, spaced at uniform intervals in frequency. If the sampling rate is selected appropriately, then the desired signal will be aliased to zero. This allows the receiver to dwell on a single frequency, and still search for signals, reducing acquisition time. For the example of WiMedia physical layer, the anti-aliasing filter will be widened to accommodate the three bands that the signal is hopping on, but the ADC sampling rate will be according to only one band. This causes aliasing but at any given symbol, only one of the three bands are active and hence the aliasing will only down convert the higher band signals to the baseband. This allows the packet detection algorithms to operate on every symbol instead of once every three symbols (once every three hops), speeding up the acquisition time. If the controller detects the presence of undesired signals in output of the ADC, then the sampling rate might be increased to limit aliasing and then the detection might proceed along more traditional lines.

While various embodiments of the present invention have been described above, it should be understood that they have been presented by way of example only, and not of limitation. Likewise, the various diagrams might depict an example architectural or other configuration for the invention, which is done to aid in understanding the features and functionality that might be included in the invention. The invention is not restricted to the illustrated example architectures or configurations, but the desired features might be implemented using a variety of alternative architectures and configurations. Indeed, it will be apparent to one of skill in the art how alternative functional, logical or physical partitioning and configurations might be implemented to implement the desired features of the present invention. Also, a multitude of different constituent module names other than those depicted herein might be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the invention is described above in terms of various exemplary embodiments and implementations, it should be understood that the various features, aspects and functionality described in one or more of the individual embodiments are not limited in their applicability to the particular embodiment with which they are described, but instead might be applied, alone or in various combinations, to one or more of the other embodiments of the invention, whether or not such embodiments are described and whether or not such features are presented as being a part of a described embodiment. Thus the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more," or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that might be available or known now or at any time in the future. Likewise, where this document refers to technologies that would be apparent or known to one of ordinary skill in the art, such technologies encompass those apparent or known to the skilled artisan now or at any time in the future.

A group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the invention might be described or claimed in the singular, the plural is contemplated to be within the scope thereof unless limitation to the singular is explicitly stated.

The presence of broadening words and phrases such as "one or more," "at least," "but not limited to" or other like phrases in some instances shall not be read to mean that the narrower case is intended or required in instances where such broadening phrases might be absent. The use of the term "module" does not imply that the components or functionality described or claimed as part of the module are all configured in a common package. Indeed, any or all of the various components of a module, whether control logic or other components, might be combined in a single package or separately maintained and might further be distributed across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives might be implemented without confinement to the illustrated examples. For example, block diagrams and their accompanying description should not be construed as mandating a particular architecture or configuration.

What is claimed is:

1. An electronic device comprising:
an analog-to-digital converter configured to have an adjustable sampling rate; and
a rate adjustment module coupled to the analog-to-digital converter and configured to control the adjustable sampling rate of the analog-to-digital converter by:
monitoring a communication environment and setting the sampling rate so as to eliminate aliasing from an undesired signal in an adjacent communication channel.

2. The device of claim 1, wherein the condition of the environment is determined by monitoring a signal quality metric.

3. The device of claim 1, wherein the condition of the environment is determined by over-sampling for a short period of time to determine if an undesirable signal is present.

4. The device of claim 1, further comprising an RF detector coupled to the adjustment module and configured to monitor the environment.

5. The device of claim 1, wherein the condition of the environment is determined by monitoring a bit error rate.

6. The device of claim 1, wherein the sampling rate of the analog-to-digital converter is increased based on locating an undesirable signal close in frequency to a signal of interest.

7. The device of claim 1, wherein the sampling rate of the analog-to-digital converter is increased based on locating an undesirable signal with a high amplitude relative to a signal of interest.

8. The device of claim 1, wherein the sampling rate of the analog-to-digital converter is decreased based on locating an undesirable signal distant in frequency to a signal of interest.

9. The device of claim 1, wherein the sampling rate of the analog-to-digital converter is decreased based on locating an undesirable signal with a low amplitude relative to a signal of interest.

10. The device of claim 1, wherein the sampling rate of the analog-to-digital converter is decreased based on the absence of an undesirable signal.

11. The device of claim 1, wherein the sampling rate of the analog-to-digital converter is decreased based on the high quality of a signal of interest.

12. The device of claim 1, further comprising an anti-aliasing filter coupled to an analog input to the analog-to-digital converter.

13. The device of claim 12, wherein the analog anti-aliasing filter comprises a passive filter.

14. The device of claim 12, wherein the analog anti-aliasing filter comprises an RC filter.

15. The device of claim 12, wherein the analog anti-aliasing filter comprises an active filter.

16. The device of claim 1, further comprising a digital filter coupled to a digital output of the analog-to-digital converter and configured to digitally filter the output of the analog-to-digital converter.

17. The device of claim 1, wherein the sampling rate is greater than or equal to two times the highest frequency component of a desired signal.

18. A method of controlling an adjustable sampling rate of an analog-to-digital converter comprising the steps of:
monitoring a communication environment;
determining if an undesired signal is present in a frequency range of interest and
when the undesired signal is detected, setting the sampling rate of the analog-to-digital converter to eliminate aliasing from an undesired signal in the adjacent communication channel.

19. The method of claim 18, wherein the condition of the environment is determined by monitoring a signal quality metric.

20. The method of claim 18, wherein the condition of the environment is determined by over-sampling for a short period of time to determine if an undesirable signal is present.

21. The method of claim 18, further comprising using an RF detector to monitor the environment.

22. The method of claim 18, wherein the condition of the environment is determined by monitoring a bit error rate.

23. The method of claim 18, further comprising increasing the sampling rate of an analog-to-digital converter based on locating an undesirable signal close in frequency to a signal of interest.

24. The method of claim 18, further comprising increasing the sampling rate of an analog-to-digital converter based on locating an undesirable signal with a high amplitude relative to a signal of interest.

25. The method of claim 18, further comprising increasing the sampling rate of the analog-to-digital converter based on locating an undesirable signal distant in frequency to a signal of interest.

26. The method of claim 18, wherein the sampling rate of the analog-to-digital converter is decreased based on locating an undesirable signal with a low amplitude relative to a signal of interest.

27. The method of claim 18, wherein the sampling rate of the analog-to-digital converter is decreased based on the absence of an undesirable signal.

28. The method of claim 18, wherein the sampling rate of the analog-to-digital converter is decreased based on the high quality of a signal of interest.

29. The method of claim 18, further comprising filtering an analog input to the analog-to-digital converter.

30. The method of claim 18, further comprising digitally filtering a digital output of the analog-to-digital converter.

31. The method of claim 18, further comprising using a sampling rate that is greater than or equal to two times the highest frequency component of a desired signal.

* * * * *